(12) United States Patent
Yang et al.

(10) Patent No.: US 7,935,586 B2
(45) Date of Patent: May 3, 2011

(54) THIN FILM TRANSISTOR AND METHOD FOR FABRICATING THE SAME

(75) Inventors: Tae-Hoon Yang, Seongnam-si (KR); Ki-Yong Lee, Yongin-si (KR); Jin-Wook Seo, Suwon-si (KR); Byoung-Keon Park, Incheon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/853,263

(22) Filed: Aug. 9, 2010

(65) Prior Publication Data

US 2011/0020990 A1 Jan. 27, 2011

Related U.S. Application Data

(62) Division of application No. 11/493,044, filed on Jul. 25, 2006, now Pat. No. 7,838,352, which is a division of application No. 11/019,658, filed on Dec. 20, 2004, now abandoned.

(30) Foreign Application Priority Data

Jun. 30, 2004 (KR) .......................... 10-2004-0050915

(51) Int. Cl.
*H01L 21/84* (2006.01)

(52) U.S. Cl. ................. 438/166; 438/486; 257/E21.412

(58) Field of Classification Search .................. 438/166, 438/486; 257/E21.411, E21.412, E21.533, 257/E21.535

See application file for complete search history.

(56) References Cited

U.S. PATENT DOCUMENTS

| | | | |
|---|---|---|---|
| 5,403,772 A | 4/1995 | Zhang et al. | |
| 5,514,880 A | 5/1996 | Nishimura et al. | |
| 5,529,937 A | 6/1996 | Zhang et al. | |
| 5,563,426 A | 10/1996 | Zhang et al. | |

(Continued)

FOREIGN PATENT DOCUMENTS

JP 6-333826 2/1994

(Continued)

OTHER PUBLICATIONS

European Office action dated Mar. 28, 2007, for EP04 090 506.9, in the name of Samsung SDI Co., Ltd.

(Continued)

*Primary Examiner* — Matthew W Such
(74) *Attorney, Agent, or Firm* — Christie, Parker & Hale, LLP

(57) ABSTRACT

A thin film transistor that has improved characteristics and uniformity is developed by uniformly controlling low concentration of crystallization catalyst and controlling crystallization position so that no seed exists and no grain boundary exists, or one grain boundary exists in a channel layer of the thin film transistor. The thin film transistor includes a substrate; a semiconductor layer pattern which is formed on the substrate, the semiconductor layer pattern having a channel layer of which no seed exists and no gram boundary exists; a gate insulating film formed on the semiconductor layer pattern; and a gate electrode formed on the gate insulating film. A method for fabricating the thin film transistor includes forming an amorphous silicon layer on a substrate; forming a semiconductor layer pattern having a channel layer in which no seed exists and no grain boundary exists by crystallizing and patterning the amorphous silicon layer; forming a gate insulating film on the semiconductor layer pattern; and forming a gate electrode on the gate insulating film.

5 Claims, 10 Drawing Sheets

U.S. PATENT DOCUMENTS

| | | | | |
|---|---|---|---|---|
| 5,681,759 | A | 10/1997 | Zhang | |
| 5,837,569 | A * | 11/1998 | Makita et al. | 438/166 |
| 5,879,977 | A | 3/1999 | Zhang et al. | |
| 6,011,275 | A | 1/2000 | Ohtani et al. | |
| 6,162,667 | A * | 12/2000 | Funai et al. | 438/166 |
| 6,228,693 | B1 | 5/2001 | Maekawa et al. | |
| 6,235,563 | B1 * | 5/2001 | Oka et al. | 438/166 |
| 6,346,437 | B1 | 2/2002 | Maekawa et al. | |
| 6,396,104 | B2 | 5/2002 | Maekawa et al. | |
| 6,426,246 | B1 * | 7/2002 | Chang et al. | 438/166 |
| 6,511,871 | B2 | 1/2003 | Joo et al. | |
| 6,759,679 | B2 * | 7/2004 | Lee | 257/66 |
| 7,601,565 | B2 | 10/2009 | Seo et al. | |
| 2001/0013607 | A1 | 8/2001 | Miyasaka | |
| 2001/0018240 | A1 * | 8/2001 | Joo et al. | 438/166 |
| 2001/0048108 | A1 | 12/2001 | Park et al. | |
| 2002/0058365 | A1 | 5/2002 | Lee et al. | |
| 2002/0100909 | A1 | 8/2002 | Yamaguchi et al. | |
| 2002/0197794 | A1 | 12/2002 | Lee | |
| 2003/0067004 | A1 | 4/2003 | Nakazawa et al. | |
| 2003/0113957 | A1 * | 6/2003 | So | 438/149 |
| 2003/0132437 | A1 | 7/2003 | Yamaguchi et al. | |
| 2003/0218177 | A1 | 11/2003 | Yamazaki | |
| 2003/0228723 | A1 | 12/2003 | Yamazaki et al. | |
| 2003/0234395 | A1 | 12/2003 | Kokubo et al. | |
| 2004/0106237 | A1 | 6/2004 | Yamazaki | |
| 2004/0241934 | A1 | 12/2004 | Inoue | |
| 2005/0072976 | A1 | 4/2005 | Cleeves et al. | |
| 2005/0158928 | A1 | 7/2005 | So | |
| 2006/0130939 | A1 | 6/2006 | Jang et al. | |

FOREIGN PATENT DOCUMENTS

| | | |
|---|---|---|
| JP | 6-85220 | 3/1994 |
| JP | 8-298326 | 11/1996 |
| JP | 10-214974 | 8/1998 |
| JP | 2000-36465 | 2/2000 |
| JP | 2001-326176 | 11/2001 |
| JP | 2001-345451 | 12/2001 |
| JP | 2003-179072 | 6/2003 |
| JP | 2005-79198 | 3/2005 |
| KR | 2003-0060403 | 7/2003 |
| WO | WO 2004428505 A1 | 5/2004 |

OTHER PUBLICATIONS

Korean Patent Abstracts for Publication No. 1020030060403, Date of publication of application Jul. 16, 2003, in the name of J. Choi et al.

European Search Report, dated Jun. 1, 2005, for application No. 04090506.9, in the name of Samsung SDI Co., Ltd.

U.S. Office action dated Sep. 3, 2008, for corresponding U.S. Appl. No. 11/019,658, indicating relevance of references listed in this IDS.

Office action, with English translation, dated Dec. 28, 2007, for corresponding Chinese Patent Application No. 2004100758951, indicating the relevance of US 2001/0018240 A1; US 5,514,880; US 6,346,437 B1; and WO 2004/042805 A1. US 5,514,880, US 6,346,437 B1; and WO 2004/042805 A1 were cited in an IDS dated Jul. 25, 2006.

Patent Abstracts of Japan, Publication No. 06-333826, dated Dec. 2, 1994; in the name of Hironori Tsukamoto et al.

* cited by examiner

THIN FILM TRANSISTOR AND METHOD FOR FABRICATING THE SAME

CROSS REFERENCE TO RELATED

This application is a divisional application of U.S. patent application Ser. No. 11/493,044 filed on Jul. 25, 2006, now U.S. Pat. No. 7,838,352 which is a divisional of U.S. patent application Ser. No. 11/019,658, filed on Dec. 20, 2004, now abandoned which claims priority to and the benefit of Korean Patent Application No. 10-2004-0050915, filed on Jun. 30, 2004, the entire contents of which are incorporated herein by reference in their entirety.

BACKGROUND OF THE INVENTION

1. Field of the Invention

The present invention relates to a thin film transistor and a method for fabricating the same, more particularly, to a thin film transistor having a channel layer of which no seed exists and no grain boundary exists, or one grain boundary exists, and a method for fabricating the thin film transistor.

2. Description of Related Art

Generally, a polycrystalline silicon layer is used for various purposes as a semiconductor layer for a thin film transistor. For example, since the polycrystalline silicon layer has a high electric field effect and mobility, it can be applied to circuits operated at high speed, and it enables Complementary Metal Oxide Semiconductor (CMOS) circuit to be constructed. A thin film transistor using the polycrystalline silicon layer can also be used in an active element of an active matrix liquid crystal display (AMLCD) and a switching element and a driving element of an organic light emitting diode (OLED).

The polycrystalline silicon layer used in the thin film transistor is fabricated by direct deposition, high temperature thermal annealing or laser annealing. In case of the laser annealing, while it can be performed at low temperature, and can result in high electric field effect and mobility, many alternative technologies are being studied because of the requirement for expensive laser equipment.

At present, a method for crystallizing amorphous silicon using metal is mostly being studied since the method has merits that the amorphous silicon is promptly crystallized at a lower temperature compared with solid phase crystallization. The crystallization method using metal can be categorized into a metal induced crystallization method and a metal induced lateral crystallization method. Regardless of its category, however, the crystallization method using metal has the problem that characteristics of elements for thin film transistors are deteriorated by metal contamination.

As such a technology of forming a good polycrystalline silicon layer by controlling concentration of ions of metal through an ion injector has been developed. The technology performs high temperature annealing, rapid thermal annealing or laser irradiation and a method for crystallizing the thin film by thermal annealing after depositing a thin film by spin coating a mixture of organic film having viscous property and liquid phase metal on the polycrystalline silicon layer to flatten the surface of polycrystalline silicon layer as metal induced crystallization are developed to reduce quantity of metal and form a polycrystalline silicon layer of good quality. However, even in this case, there are problems in aspects of scale-up of grain size and uniformity of grain in the polycrystalline silicon layer.

In order to solve the foregoing problems, a method for manufacturing polycrystalline silicon layer as a crystallization method using a capping (or cover) layer has been developed as disclosed in Korean Patent Laid-open Publication No. 10-2003-0060403. The disclosed method uses an amorphous silicon layer that is formed on a substrate, and a capping layer is formed on the amorphous silicon layer. Subsequently, a seed is formed by depositing a metal catalyst layer capping layer and diffusing metal catalyst into the amorphous silicon layer through the capping layer by thermal annealing or laser annealing. A polycrystalline silicon layer is obtained using the formed seed. This method has merits in reducing metal contamination because the metal catalyst is diffused through the capping (or cover) layer.

However, the foregoing method has problems in that it is difficult to uniformly control low concentration of crystallization catalyst and control crystallization position and grain size. Particularly, the foregoing method has problems in that it is difficult to control the number of boundaries between the seeds and the grains since characteristics and uniformity of elements for thin film transistors are greatly influenced by the number of boundaries between seeds and grains formed in a channel of the thin film transistor.

SUMMARY OF THE INVENTION

It is an aspect of the present invention to provide a thin film transistor for uniformly controlling a concentration of a crystallization catalyst and a crystallization position so that no seed exists and no grain boundary exists in a channel layer of the thin film transistor or for controlling the number of seeds or grain boundaries so that characteristics and uniformity of the thin film transistor are improved, and a method for fabricating the thin film transistor.

One exemplary embodiment of the present invention provides a thin film transistor. The thin film transistor includes a substrate; a semiconductor layer pattern formed on the substrate, the semiconductor layer pattern having a channel layer, the channel layer having no seed and no grain boundary; a gate insulating film formed on the semiconductor layer pattern; and a gate electrode formed on the gate insulating film.

A seed may be formed in a source region or a drain region of the semiconductor layer pattern, and a width and a length of the semiconductor layer pattern may each be shorter than a radius of a grain formed by the seed.

A seed may be formed on an outer part of the channel layer between a source region and a drain region of the semiconductor layer pattern, and a width and a length of the semiconductor layer pattern may each be shorter than a diameter of a grain formed by the seed.

The channel layer may have a crystallinity or a crystallization ratio of about 0.7 to 0.9.

One exemplary embodiment of the present invention provides a thin film transistor. The thin film transistor includes a substrate; a semiconductor layer pattern formed on the substrate, the semiconductor layer pattern has a channel layer, the channel layer having a single grain boundary; a gate insulating film formed on the semiconductor layer pattern; and a gate electrode formed on the gate insulating film.

A seed may be formed in a source region or a drain region of the semiconductor layer pattern, and a length of the semiconductor layer pattern may be about 1.1 to 1.3 times a radius of a grain formed by the seed.

The thin film transistor may further include a buffer layer formed between the substrate and the semiconductor layer pattern. The buffer layer may be formed of a silicon nitride film or a silicon oxide film.

The thin film transistor may be used in a liquid crystal layer (LCD) device or an organic electroluminescence device.

One exemplary embodiment of the present invention provides a method for fabricating a thin film transistor. The method includes forming an amorphous silicon layer on a substrate; forming a semiconductor layer pattern having a channel layer in which no seed exists and no grain boundary exists by crystallizing and patterning the amorphous silicon layer; forming a gate insulating film on the semiconductor layer pattern; and forming a gate electrode on the gate insulating film.

The forming the semiconductor layer pattern may include forming a capping layer on the amorphous silicon layer; forming a grooved part on the capping layer so that a seed is formed in a source region or a drain region of the semiconductor layer pattern; forming a metal catalyst layer on the capping layer; diffusing a metal catalyst of the metal catalyst layer into the amorphous silicon layer; and forming a polycrystalline silicon layer by crystallizing the amorphous silicon layer using the diffused metal catalyst.

The forming the semiconductor layer pattern may include forming a first capping layer on the amorphous silicon layer; patterning the first capping layer so that a seed is formed in a source region or a drain region of the semiconductor layer pattern; forming a second capping layer on the patterned first capping layer; tanning a metal catalyst layer on the second capping layer; diffusing a metal catalyst of the metal catalyst layer into the amorphous silicon layer; and forming a polycrystalline silicon layer by crystallizing the amorphous silicon layer using the diffused metal catalyst.

The semiconductor layer pattern may be formed in such a manner that a width and a length of the semiconductor layer pattern are each shorter than a radius of a grain formed by the seed.

The forming the semiconductor layer pattern may include forming a capping layer on the amorphous silicon layer; forming a grooved part on the capping layer so that a seed is formed on an outer part of a channel layer between a source region and a drain region of the semiconductor layer pattern; forming a metal catalyst layer on the capping layer; diffusing a metal catalyst of the metal catalyst layer into the amorphous silicon layer; and forming a polycrystalline silicon layer by crystallizing the amorphous silicon layer using the diffused metal catalyst.

The forming the semiconductor layer pattern may include forming a first capping layer on the amorphous silicon layer; patterning the first capping layer so that a seed is formed on an outer part of a channel layer between a source region and a drain region of the semiconductor layer pattern; forming a second capping layer on the patterned first capping layer; forming a metal catalyst layer on the second capping layer; diffusing a metal catalyst of the metal catalyst layer into the amorphous silicon layer; and forming a polycrystalline silicon layer by crystallizing the amorphous silicon layer using the diffused metal catalyst.

The semiconductor layer pattern may be formed in such a manner that a width and a length of the semiconductor layer pattern are each shorter than a diameter of a grain formed by the seed.

One exemplary embodiment of the present invention provides a method for fabricating a thin film transistor. The method includes forming an amorphous silicon layer on a substrate; forming a semiconductor layer pattern having a channel layer in which one grain boundary exists by crystallizing and patterning the amorphous silicon layer; forming a gate insulating film on the semiconductor layer pattern; and forming a gate electrode on the gate insulating film.

The semiconductor layer pattern may be formed in such a way that a length of the semiconductor layer pattern is about 1.1 to 1.3 times a radius of a grain.

The capping layer may be formed of a silicon nitride film or a silicon oxide film, The first capping layer pattern and the second capping layer may each be formed of a silicon nitride film or a silicon oxide film.

A thickness of a part of the first capping layer pattern may be thicker than that of the second capping layer.

A density of a part of the first capping layer pattern may be higher than that of the second capping layer.

BRIEF DESCRIPTION OF THE DRAWINGS

The accompanying drawings, together with the specification, illustrate exemplary embodiments of the present invention, and, together with the description, serve to explain the principles of the present invention.

EXPLANATION OF MARKS FOR CERTAIN PARTS OF DRAWINGS

Figure 1:
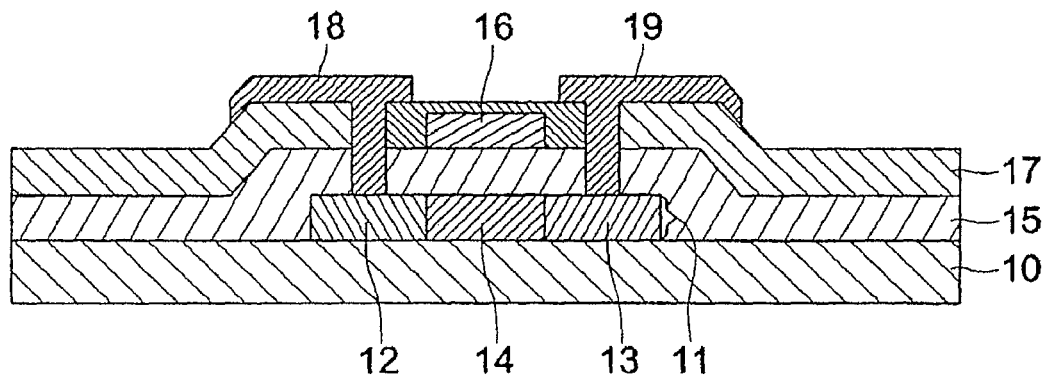
FIG. 1 is a cross sectional structure chart of a thin film transistor according to one embodiment of the present invention.

| | |
|---|---|
| 10, 70, 80, 90: substrate | 11, 76: semiconductor layer pattern |
| 12, 22, 32, 42, 77a: source region | 13, 23, 33, 43, 77b: drain region |
| 14, 24, 34, 44, 77c: channel layer | 21, 31, 41, 75, 85, 95: seed |
| W: width of the semiconductor layer pattern | |
| L: length of the semiconductor layer pattern | |
| R: diameter of grain | r: radius of grain |
| 71, 81, 91: amorphous silicon layer | 72: first capping layer pattern |
| 73: second capping layer | 74, 84, 94: metal catalyst |
| 82: first capping layer | 83: second capping layer pattern |
| 92: capping layer | |

DETAILED DESCRIPTION

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive. There may be parts shown in the drawings, or parts not shown in the drawings, that are not discussed in the specification as they are not essential to a complete understanding of the invention. Like reference numbers designate like elements.

FIG. 1 is a cross sectional structure chart of thin film transistor according to one exemplary embodiment of the present invention.

Referring to FIG. 1, a semiconductor layer pattern 1 is formed on a substrate 10. An insulating substrate can be used as the substrate 10. The semiconductor layer pattern II is formed of source/drain regions 12, 13 and a channel layer 14. No seed exists and no grain boundary exists in the channel layer 14, or only one grain boundary exists in the channel layer 14. Since existence of seeds in the channel layer 14 causes deterioration and non-uniformity of characteristics of thin film transistors, the channel layer 14 is controlled in such a way that no seed exists and no grain boundary exists or only one grain boundary exists in the channel layer 14 through a pattern of a first capping layer used during crystallization of the embodiment of FIG. 1.

As shown in FIG. 1, a gate insulating film 15 is formed on the semiconductor layer pattern 11, and a gate electrode 16 is formed on the gate insulating film 15. An interlayer insulating film 17 including contact holes is formed on an upper part of the gate insulating film 15 and the gate electrode 16, and source/drain electrodes 18, 19 contacted with source/drain regions 12, 13 through the contact holes are formed on the interlayer insulating film 17.

Figure 2:
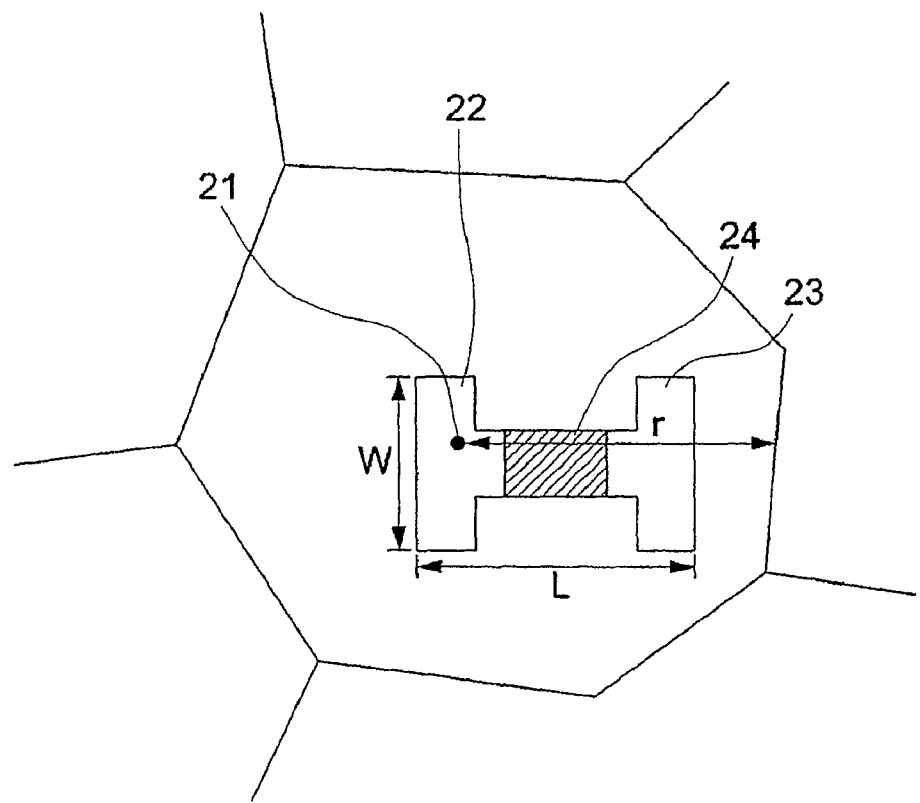
FIG. 2 is a plan view of a semiconductor layer pattern according to a first exemplary embodiment of the present invention.

FIG. 2 is a plan view of semiconductor layer pattern according to a first exemplary embodiment of the present invention.

Referring to FIG. 2, a semiconductor layer pattern is formed on a growth completed grain, seeds 21 are formed in a source region 22, and no seed exists and no grain boundary exists in a channel layer 24. Width W and length L of the semiconductor layer pattern are each shorter than radius r of the grain. Width W of the semiconductor layer pattern is the width of the source/drain regions 22, 23, and length L of the semiconductor layer pattern is the total length of the source/drain regions 21, 23 and the channel layer 24 as illustrated in FIG. 2.

Alternatively, the seeds 21 can be formed in the drain region 23.

Figure 3:
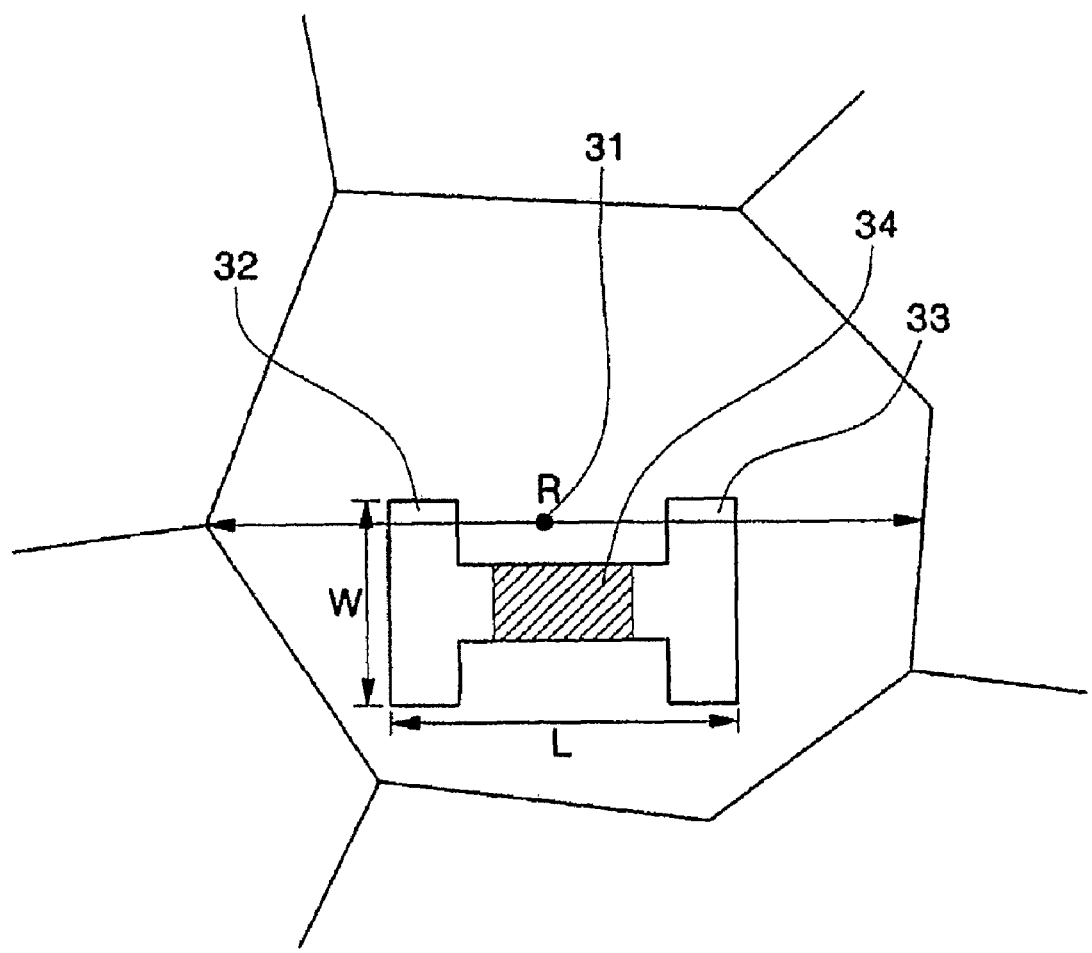
FIG. 3 is a plan view of a semiconductor layer pattern according to a second exemplary embodiment of the present invention.

FIG. 3 is a plan view of a semiconductor layer pattern according to a second exemplary embodiment of the present invention.

Referring to FIG. 3, a seed 31 is formed on an outer part of a channel layer 34 between a source region 32 and a drain region 33, and no seed exists and no grain boundary exists in the channel layer 34, where width W and length L of the semiconductor layer pattern are each shorter than diameter R of the grain.

Figure 4:
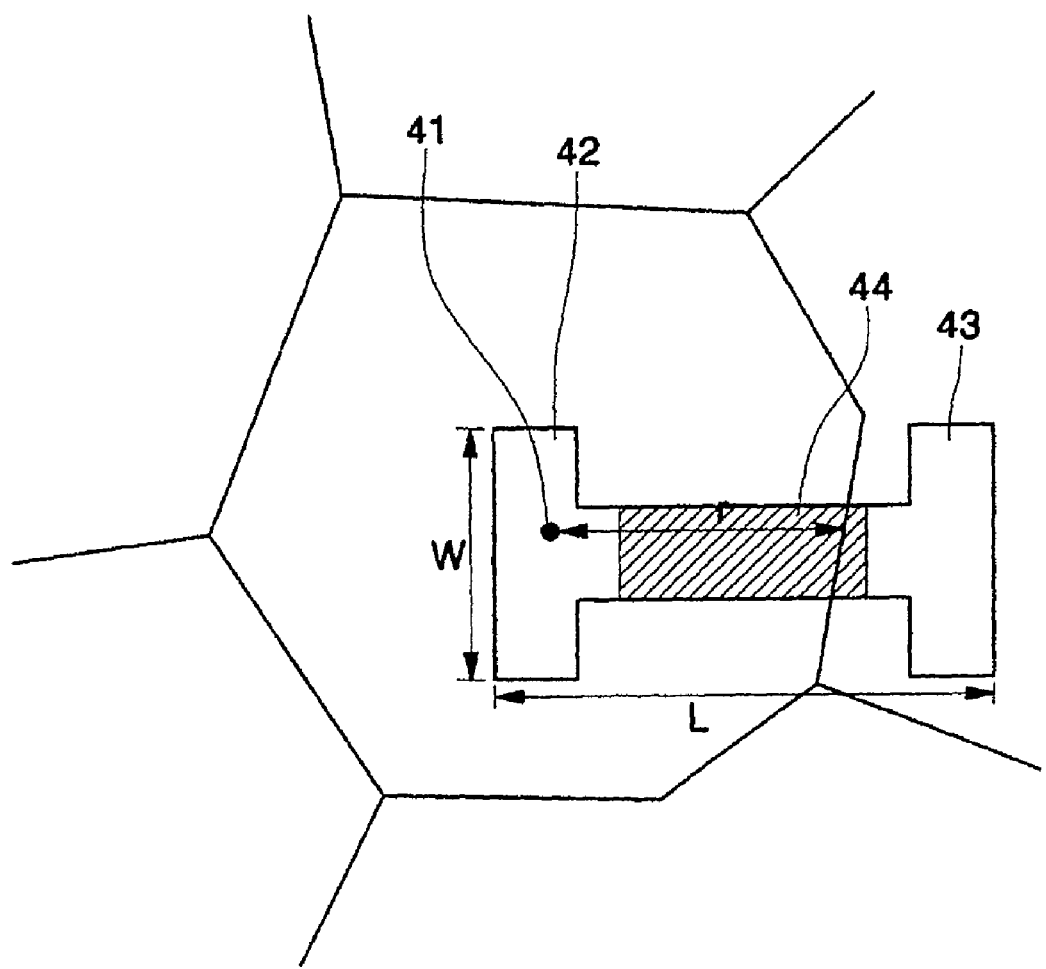
FIG. 4 is a plan view of a semiconductor layer pattern according to a third exemplary embodiment of the present invention.

FIG. 4 is a plan view of a semiconductor layer pattern according to a third exemplary embodiment of the present invention.

Referring to FIG. 4, a seed 41 is formed in a source region 42, no seed exists in a channel layer 44, but one grain boundary exists in the channel layer, where width W and length L of the semiconductor layer pattern are each about 1.1 to 1.3 times of radius r of the grain.

Alternatively, the seed 41 can be formed in a drain region 43.

Figure 5:
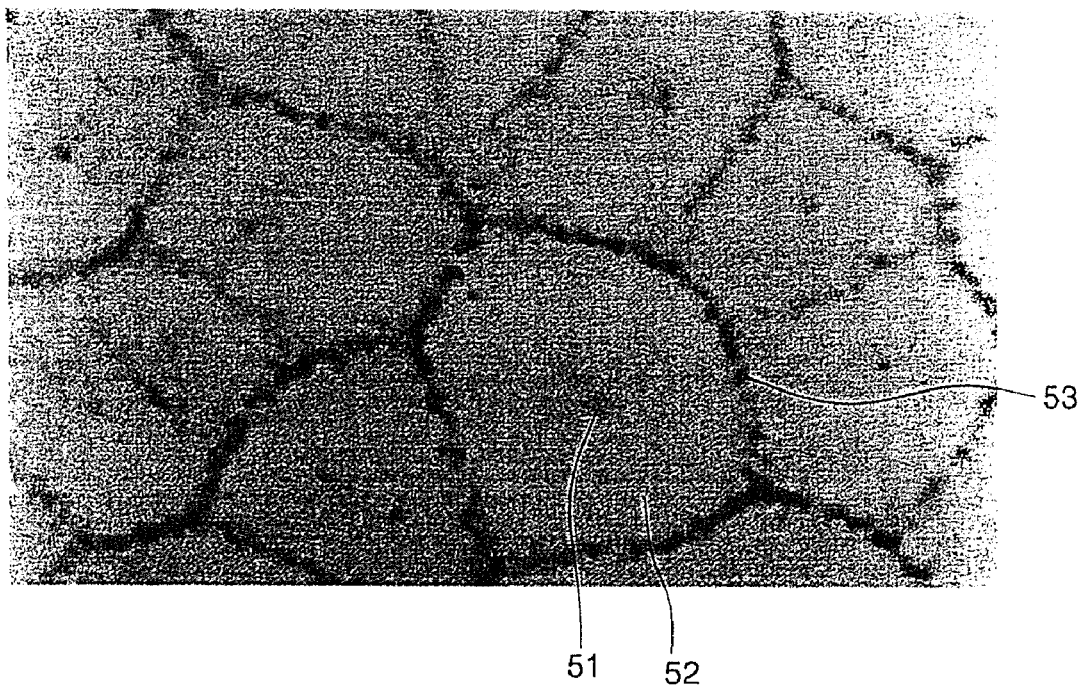
FIG. 5 is a scanning electron microscope (SEM) photograph of a growth completed grain.

FIG. 5 is a scanning electron microscope (SEM) photograph of a growth completed grain. The completed grain has a grain central part 51, a grain boundary 52, and a part 52 between the grain central part 51 and the grain boundary 53.

Figure 6A:
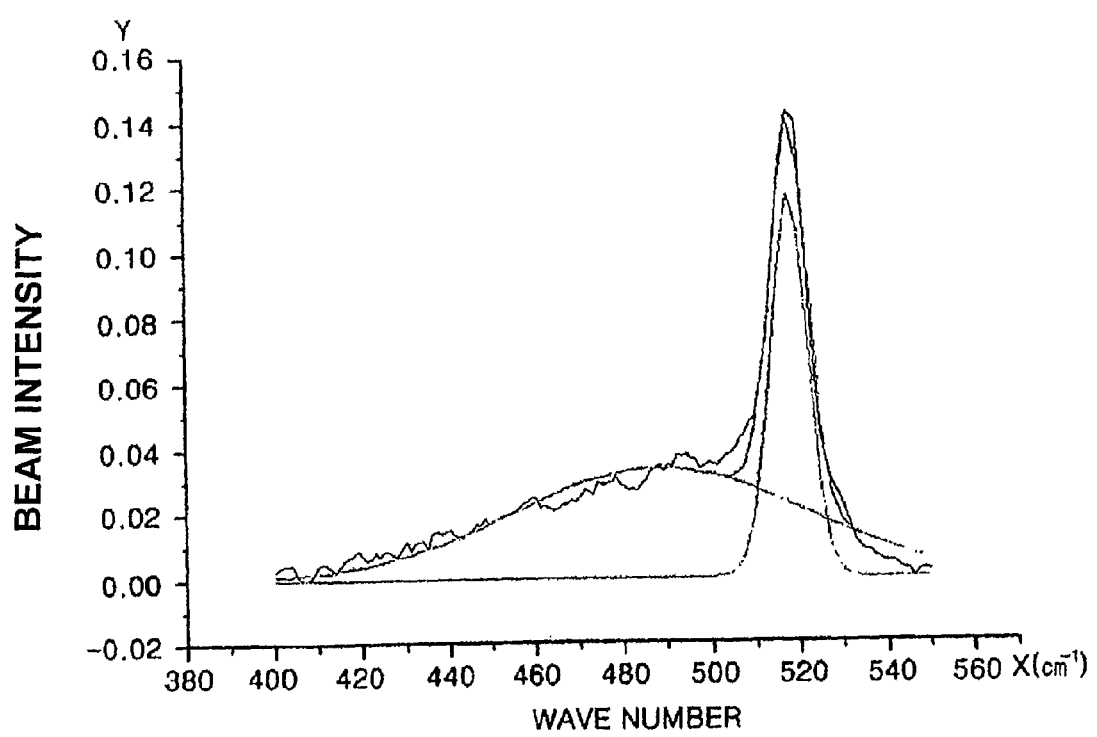
FIG. 6A, FIG. 6B, and FIG. 6C are Raman graphs for showing difference of crystallinity according to a position inside a grain.
Figure 6B:
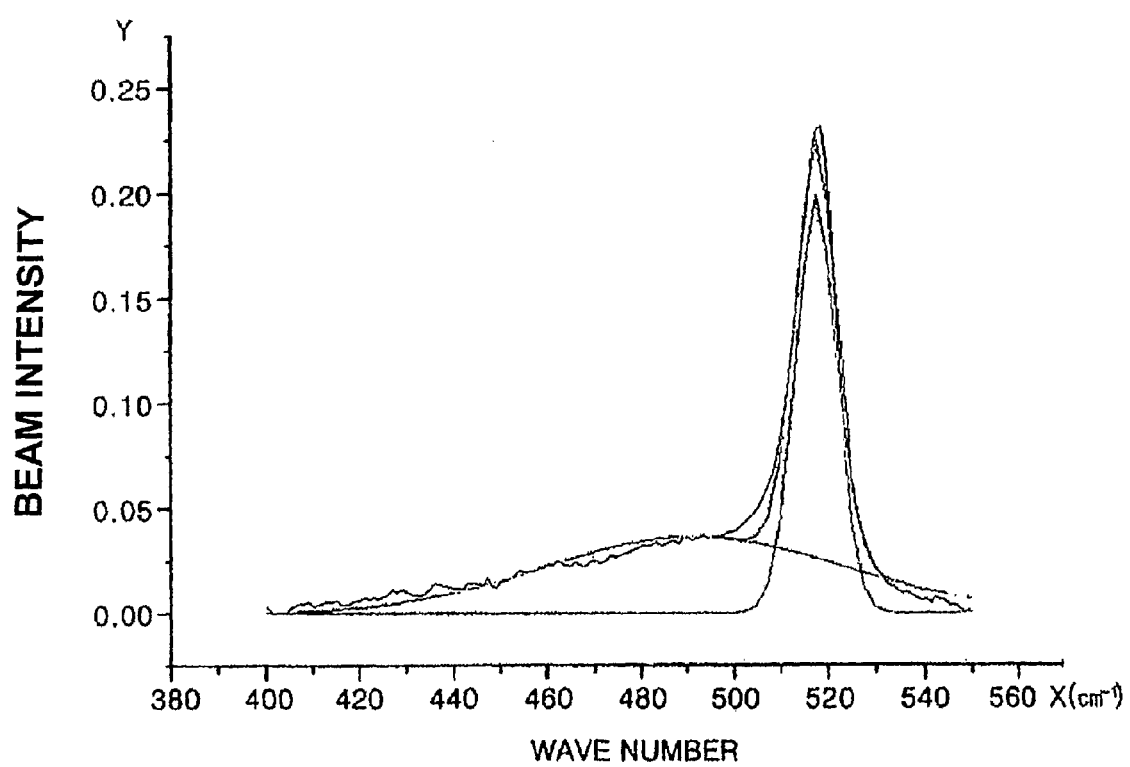
Figure 6C:
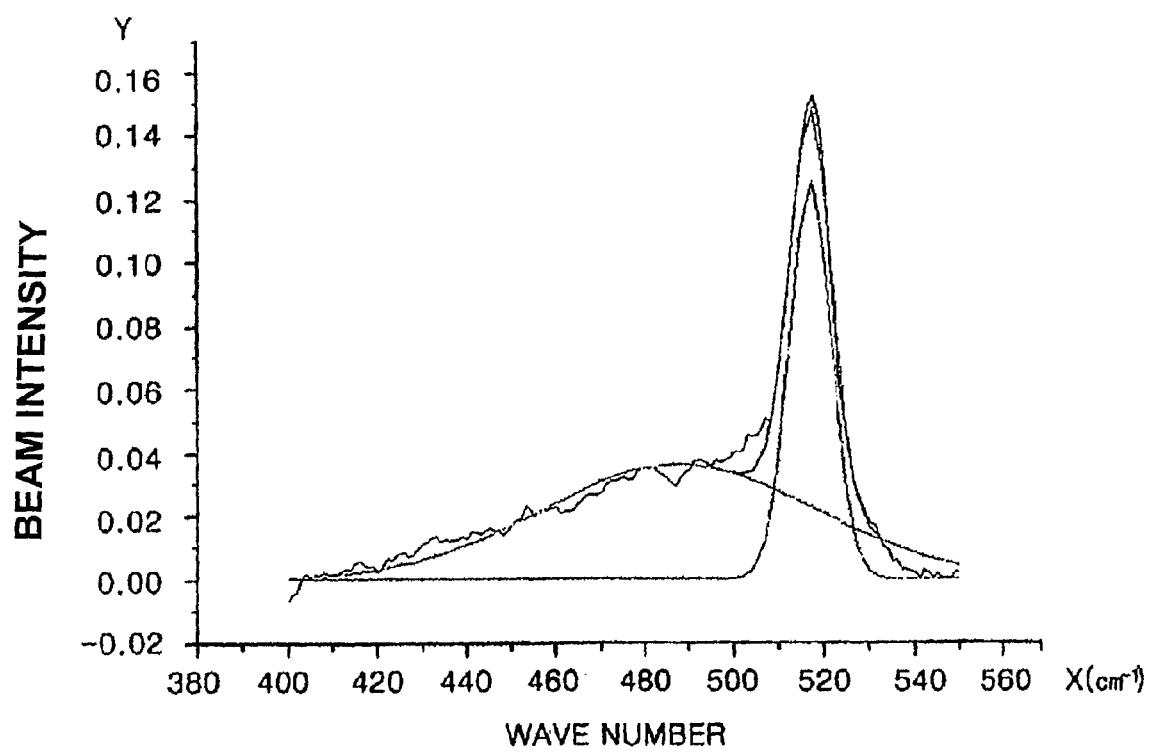

FIG. 6A, FIG. 6B, and FIG. 6C are Raman graphs for showing the difference of crystallinity according to the position inside the grain illustrated in FIG. 5, where an X-axis shows applied wave number $cm^{-1}$ and a Y axis shows beam intensity of the measured component. The crystallinity is represented as a relative ratio value of the beam intensity of crystal component to the beam intensity of amorphous component. In the Raman graphs, a sluggish part indicates an amorphous component, and a peak part indicates a crystal component.

FIG. 6A shows crystallinity of a grain central part. The measured crystallinity of the grain central part is about 0.45. That is, the number of amorphous components is greater than that of crystal components, and the crystallinity is very low.

FIG. 6C shows crystallinity on a grain boundary. The measured crystallinity on the grain boundary is 0.52. That is, the crystallinity on the grain boundary is also very low although it is somewhat higher than crystallinity at the grain central part.

FIG. 6B shows crystallinity on a part between the grain central part and the grain boundary. The measured crystallinity on the part between the grain central part and the grain boundary is 0.74. That is, the crystallinity on the part between the grain central part and the grain boundary is substantially higher than that at the grain central part and that at the grain boundary.

As described above, characteristics of thin film transistors can be displayed evenly or unevenly according to a formation position of the channel layer since crystallization ratio varies according to a position of the channel layer inside the gram even in one grain. In one embodiment of the present invention, a part having crystallinity of about 0.7 to 0.9 or about 0.74 is used as the channel layer. By controlling the channel layer in such a manner, no seed has to exist and no grain boundary has to exist in the channel layer, or one grain boundary exists in the channel layer.

Figure 8:
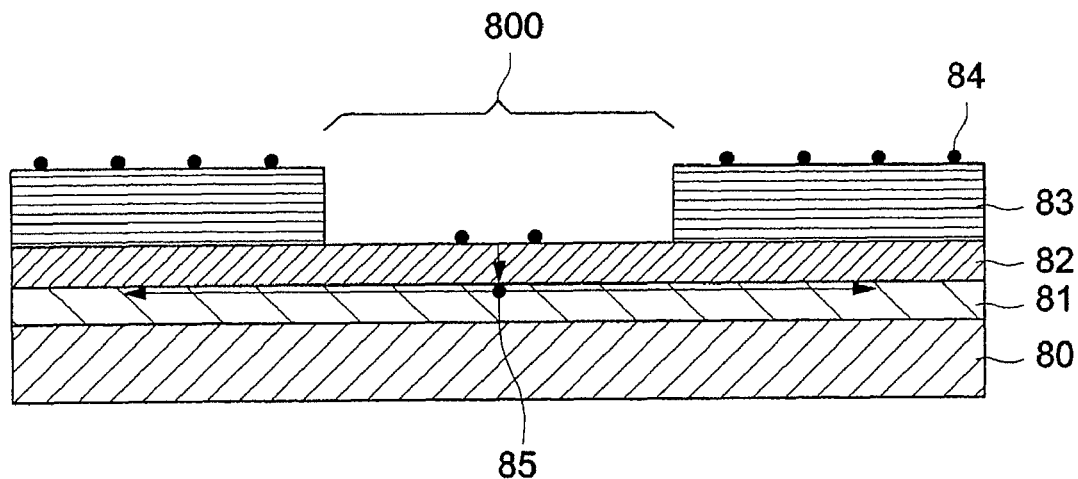
FIG. 8 is a cross sectional structure chart for explaining a second exemplary method for fabricating a thin film transistor according to the present invention.
Figure 9:
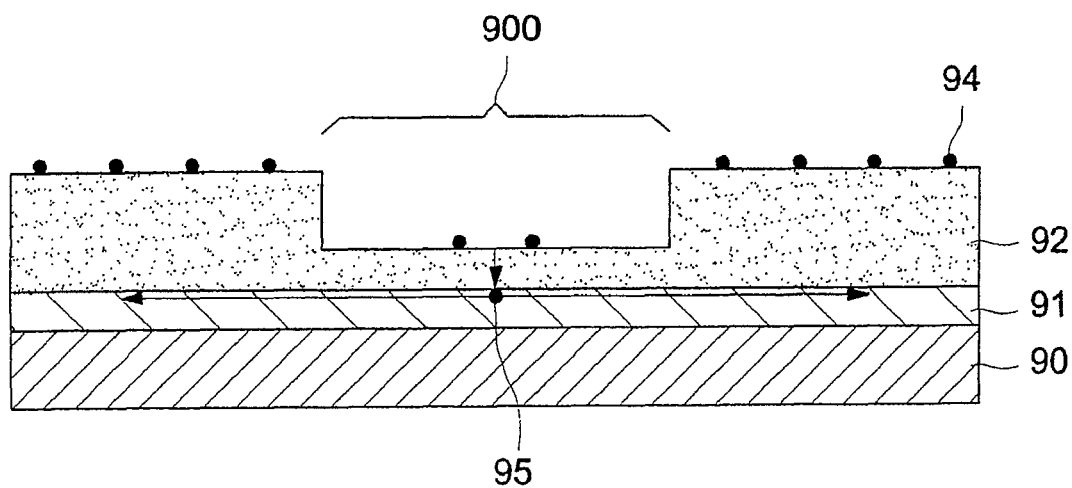
FIG. 9 is a cross sectional stricture chart for explaining a third exemplary method for fabricating thin film transistor according to the present invention.

FIG. 7A, FIG. 7B, FIG. 7C, and FIG. 7D are cross sectional structure charts for explaining a first exemplary method for fabricating thin film transistors according to the present invention. FIG. 8 is a cross sectional structure chart for explaining a second exemplary method for fabricating thin film transistors according to the present invention, and FIG. 9 is a cross sectional structure chart for explaining a third exemplary method for fabricating thin film transistors according to the present invention.

Figure 7A:
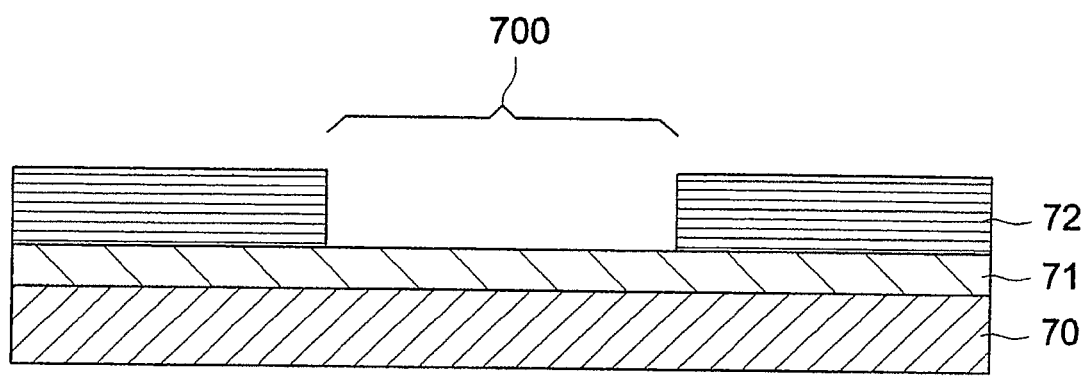
FIG. 7A, FIG. 7B, FIG. 7C, and FIG. 7D are cross sectional structure charts for explaining a first exemplary method for fabricating a thin film transistor according to the present invention.

Referring to FIG. 7A, an amorphous silicon layer 71 is deposited on a substrate 70. The amorphous silicon layer 71 can be formed by chemical vapor deposition (CVD) using plasma.

First capping layer is then formed on the amorphous silicon layer 71. The first capping layer can be formed of a silicon nitride film or a silicon oxide film by plasma enhanced chemical vapor deposition (PECVD). Subsequently, first capping layer pattern 72 having a hollow part 700 is formed by patterning the first capping layer. A seed to be mentioned later is formed in a source region or a drain region, and the first capping layer is patterned on a channel layer so that no seed exists and no grain boundary exists in the channel layer. Alternatively, the seed can be formed on an outer part of the channel layer between the source region and the drain region, and the first capping layer can be patterned on the channel layer so that no seed exists and no grain boundary exists in the channel layer. In addition, the seed can be formed in the source region or the drain region, and the first capping layer can be patterned on the channel layer so that one grain boundary exists in the channel layer although no seed exists in the channel layer.

The solid part of the first capping layer pattern 72 (i.e., not including the hollow part 700) can be formed by the silicon nitride film or the silicon oxide film having a certain control thickness or the capping layer pattern 72 have a certain control density of the silicon nitride film, or the silicon oxide film so that it substantially prevents diffusion of a metal catalyst in the solid part of the first capping layer pattern 72. That is, the solid part of the first capping layer pattern 72 functions as a metal catalyst diffusion impossible or blocking layer.

Figure 7B:
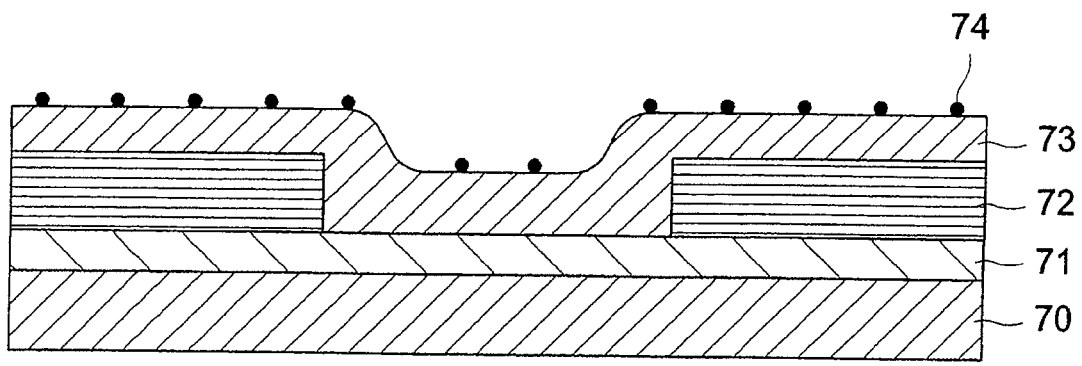

Referring to FIG. 7B, a second capping layer 73 is formed on the first capping layer pattern 72. The second capping layer 73 can be formed of a silicon nitride film or a silicon oxide film and be controlled in such a manner that thickness of the second capping layer 71 is thinner than that of the first capping layer pattern 72, or the density of the second capping layer 73 is lower than that of the first capping layer pattern 72 to enable the metal catalyst to be diffused. That is, the second capping layer 73 functions as a metal catalyst diffusion possible layer. Generally, since an oxide film or a nitride film functions as a barrier in diffusion of impurities, the oxide film or the nitride film is capable of preventing the metal catalyst from diffusing through it by increasing the density and/or the thickness of the silicon oxide film or the silicon nitride film. On the other hand, the metal catalyst can be easily diffused through either of these two films if the density and/or the thickness of the silicon oxide film or the silicon nitride film is lowered.

Subsequently, a layer of metal catalyst 74 is formed on the second capping layer 73. The metal catalyst 74 can be nickel, and the layer of metal catalyst 74 can be formed using a sputter. Alternatively, the metal catalyst 74 can be formed by an ion implantation process or a plasma process. In the plasma process, the metal catalyst 74 can be formed by arranging a metallic material on the second capping layer 73 and exposing the metallic material to plasma.

Figure 7C:
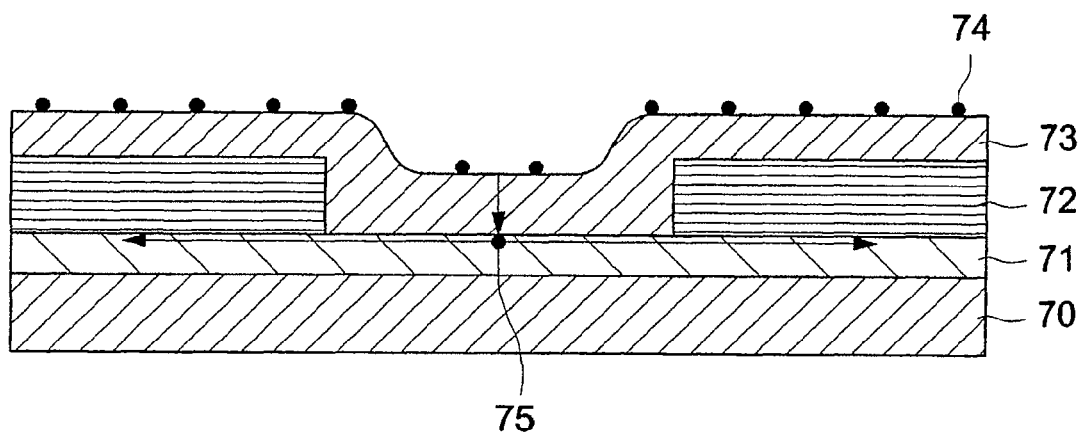

Referring to FIG. 7C, the metal catalyst 74 is diffused. The metal catalyst can be diffused by heat treating the metal catalyst at a temperature of 200 to 700° C. for one hour. The metal catalyst 74 is heat treated so that it is diffused into the amorphous silicon layer 71 after passing through the second capping layer 73. The diffused metal catalyst 74 forms a seed 75 in the amorphous silicon layer 71. The seed 75 is a metal silicide formed when the metal catalyst is contacted with the silicon. The seed 75 can be formed in a source region or drain region and on an outer part of the channel layer between the source and drain regions as described above. Crystallization to be mentioned later is performed starting from the seed 75. Generally, only about 1/100 of the metal catalyst 74 is diffused to form the seed 75. The metal catalyst 75 that is not diffused by the hollow part 700 of the first capping layer pattern 72 remains in the second capping layer 73.

Next, a polycrystalline silicon layer is formed by crystallizing the amorphous silicon layer 71. The crystallization can be performed through heat treatment, and the heat treatment can be carried out by heating the amorphous silicon layer 71 in a furnace for a long time, where a crystallization temperature of about 400 to 1,000° C. or of about 550 to 700° C. can be used. If the amorphous silicon layer 71 is heat treated in the above described temperature range, the amorphous silicon layer 71 grows to the side from the seed 75 and contacts neighboring grains to form a grain boundary and completely crystallize the amorphous silicon layer 71.

A crystallization method capable of controlling grain size and grain growing position and direction by forming a seed through selective diffusion of metal catalysts, thereby crystallizing the amorphous silicon layer as described in the above process can be referred to as a super grain silicon (SGS) method, and grains of a polycrystalline silicon layer formed by this crystallization method can be grown to a size of 3 to 400 μm.

Referring now to FIG. 8, first capping layer 82 is formed on a substrate 80 on which an amorphous silicon layer 81 is formed. The second capping layer is patterned after forming the second capping layer on the first capping layer 82. The second capping layer pattern 83 has a hollow part 800 and can be formed of a silicon nitride film or a silicon oxide film, and the second capping layer pattern 83 is controlled in such a way that thickness of the solid part of the second capping layer pattern 83 is thicker than that of the first capping layer 82, or density of the solid part of the second capping layer pattern 83 is higher than that of the first capping layer 82 so that it is impossible to diffuse a metal catalyst 84 through the solid part of the second capping layer pattern 83. That is, the second capping layer pattern 83 functions as a metal catalyst diffusion impossible or blocking layer.

A method for fabricating thin film transistors according to the second exemplary embodiment of the present invention is substantially the same as the method for fabricating thin film transistors according to first exemplary embodiment of the present invention with the exception of the above description.

Referring to FIG. 9, a capping layer 92 is formed on a substrate 90 on which an amorphous silicon layer 91 is also formed. A groove 900 is formed on the capping layer 92, and a layer of metal catalyst 94 is formed on the capping layer 92. Only one capping layer 94 is formed in this third exemplary method of FIG. 9 for fabricating thin film transistors according to the present invention, which is different from the first exemplary method of FIGS. 7A, 7B, 7C, and 7D for fabricating thin film transistors and the second exemplary method of FIG. 8 for fabricating thin film transistor. The capping layer 92 can be formed of a silicon nitride film or a silicon oxide film, and it is possible to diffuse the metal catalyst 94 into the groove formed part 900 since thickness of the groove formed part 900 is thinner than the other part of capping layer 72.

Figure 7D:
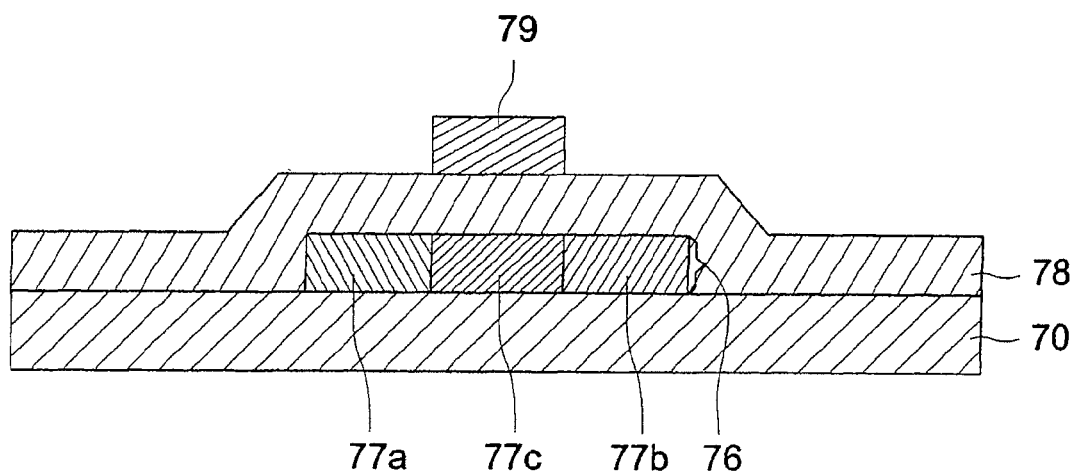

Referring to FIG. 7D, the first capping layer pattern 72, second capping layer 73 and metal catalyst 74 are removed through etching after crystallizing. The above structures 72, 73, 74 are removed to prevent or reduce metal contamination on the crystallized polycrystalline silicon layer.

Subsequently, source/drain regions 77a, 77b and channel layer 77c are formed by patterning the polycrystalline silicon layer and performing the ion implantation process. That is, a semiconductor layer pattern 76 is formed. The semiconductor layer pattern 76 can be formed in such a way that a width and a length of the semiconductor layer pattern 76 are shorter than a radius of a grain, the width and the length of the semiconductor layer pattern 76 are shorter than the diameter of the grain, and the length of the semiconductor layer pattern 76 is about 1.1 to 1.3 times the radius of the grain according to the first capping layer pattern 72 or position of crystallization as described above.

A metal layer and a photoresist layer are sequentially laid up on the gate insulating film 78 after forming a gate insulating film 78 on the semiconductor layer pattern 76. A gate electrode 79 is formed by patterning the photoresist layer and etching the metal layer using the patterned photoresist layer as a mask. A thin film transistor is completed using the resulting material.

In view of the foregoing, certain exemplary embodiments of the present invention provide a thin film transistor that has good characteristics and uniformity. The embodiments control uniform low concentration and crystallization position of the crystallization catalyst so that no seed exists and no grain boundary exists in a channel layer of the thin film transistor, or one grain boundary exists in the channel layer of the thin film transistor.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof:

What is claimed is:

1. A method for fabricating a thin film transistor comprising:
    forming an amorphous silicon layer on a substrate;
    forming a semiconductor layer pattern having a channel layer in which one grain boundary exists by crystallizing and patterning the amorphous silicon layer;
    forming a gate insulating film on the semiconductor layer pattern; and
    forming a gate electrode on the gate insulating film; wherein
    the forming the semiconductor layer pattern comprises:
    forming a first capping layer on the amorphous silicon layer;
    patterning the first capping layer so that a seed is formed in a source region or a drain region of the semiconductor layer pattern;
    forming a second capping layer on the patterned first capping layer;
    forming a metal catalyst layer on the second capping layer;
    diffusing a metal catalyst of the metal catalyst layer through at least one of the first and second capping layers into the amorphous silicon layer; and
    forming a polycrystalline silicon layer by crystallizing the amorphous silicon layer using the diffused metal catalyst.

2. The method for fabricating the thin film transistor according to claim 1, wherein the semiconductor layer pattern is formed in such a way that a length of the semiconductor layer pattern is about 1.1 to 1.3 times a radius of a grain formed by the seed.

3. The method for fabricating the thin film transistor according to claim 1, wherein the first capping layer pattern and the second capping layer are each formed of a silicon nitride film or a silicon oxide film.

4. The method for fabricating the thin film transistor according to claim 1, wherein a thickness of a part of the first capping layer pattern is thicker than that of the second capping layer.

5. The method for fabricating, the thin film transistor according to claim 1, wherein a density of a part of the first capping layer pattern is higher than that of the second capping layer.

* * * * *

UNITED STATES PATENT AND TRADEMARK OFFICE
CERTIFICATE OF CORRECTION

PATENT NO. : 7,935,586 B2  
APPLICATION NO. : 12/853263  
DATED : May 3, 2011  
INVENTOR(S) : Tae-Hoon Yang et al.

Page 1 of 1

It is certified that error appears in the above-identified patent and that said Letters Patent is hereby corrected as shown below:

On the Title Page

Item (56) References Cited  
FOREIGN PATENT DOCUMENTS, line 1

Delete "2/1994"  
Insert -- 12/1994 --

Item (57) Abstract, line 9

Delete "gram"  
Insert -- grain --

Item (56) References Cited  
FOREIGN PATENT DOCUMENTS, page 2, line 10

Delete "WO 2004428505 A1"  
Insert -- WO 20040428505 A1 --

In the Claims

Column 10, Claim 5, line 26

Delete "fabricating,"  
Insert -- fabricating --

Signed and Sealed this  
Twenty-seventh Day of March, 2012

David J. Kappos  
*Director of the United States Patent and Trademark Office*